United States Patent
Semond et al.

(10) Patent No.: US 7,767,307 B2
(45) Date of Patent: *Aug. 3, 2010

(54) PREPARATION METHOD OF A COATING OF GALLIUM NITRIDE

(75) Inventors: Fabrice Semond, Mougins le Haut (FR); Jean Claude Massies, Valbonne (FR); Nicolas Pierre Grandjean, Nice (FR)

(73) Assignee: Centre National de la Recherche Scientifique, Paris (FR)

( * ) Notice: Subject to any disclaimer, the term of this patent is extended or adjusted under 35 U.S.C. 154(b) by 223 days.

This patent is subject to a terminal disclaimer.

(21) Appl. No.: 11/832,015

(22) Filed: Aug. 1, 2007

(65) Prior Publication Data

US 2008/0048207 A1 Feb. 28, 2008
US 2008/0185611 A2 Aug. 7, 2008

Related U.S. Application Data

(63) Continuation of application No. 10/297,494, filed as application No. PCT/FR01/01777 on Jun. 8, 2001, now Pat. No. 7,273,664.

(30) Foreign Application Priority Data

Jun. 9, 2000 (FR) .................................. 00 07417

(51) Int. Cl.
*B32B 9/00* (2006.01)

(52) U.S. Cl. ........................ 428/446; 428/698; 257/414
(58) Field of Classification Search ................... None
See application file for complete search history.

(56) References Cited

U.S. PATENT DOCUMENTS 4,855,249 A 8/1989 Akasaki et al.

(Continued)

FOREIGN PATENT DOCUMENTS

EP 0 551 721 7/1993

(Continued)

OTHER PUBLICATIONS

S.A. Nikishin, et al., "High Quality Gan Grown on SI (111) by Gas Source Molecular Beam Epitaxy With Ammonia", Applied Physics Letters, vol. 75, No. 14, pp. 2073-2075, Oct. 4, 1999.

(Continued)

*Primary Examiner*—Timothy M Speer
(74) *Attorney, Agent, or Firm*—Oblon, Spivak, McClelland, Maier & Neustadt, L.L.P.

(57) ABSTRACT

The invention concerns a monocrystalline coating crack-free coating of gallium nitride or mixed gallium nitride and another metal, on a substrate likely to cause extensive stresses in the coating, said substrate being coated with a buffer layer, wherein: at least a monocrystalline layer of a material having a thickness ranging between 100 and 300 nm, preferably between 200 and 250 nm, and whereof crystal lattice parameter is less than the crystal lattice parameter of the gallium nitride or of the mixed gallium nitride with another metal, is inserted in the coating of gallium nitride or mixed gallium nitride with another metal. The invention also concerns the method for preparing said coating. The invention further concerns electronic and optoelectronic devices comprising said coating.

20 Claims, 5 Drawing Sheets

U.S. PATENT DOCUMENTS 6,730,943 B2 5/2004 Massies et al.
7,273,664 B2 * 9/2007 Semond et al. ............. 428/698

FOREIGN PATENT DOCUMENTS

| EP | 9 312546 | 12/1997 |
|----|----------|---------|
| JP | 9 199759 | 7/1997 |
| WO | 99 25030 | 5/1999 |
| WO | 00 16378 | 3/2000 |
| WO | 00 25353 | 5/2000 |

OTHER PUBLICATIONS

A.T. Schremer, et al., "High Electron Mobility AlGaN/GaN Heterostructure on (111) Si", Applied Physics Letters, vol. 76, No. 6, pp. 736-738, 2000.

U.S. Appl. No. 11/832,020, filed Aug. 1, 2007, Semond, et al.

* cited by examiner

PREPARATION METHOD OF A COATING OF GALLIUM NITRIDE

The invention relates to monocrystalline layers, and particularly to thick layers of gallium nitride or of a mixed nitride of gallium and another metal, and their preparation process.

The invention also relates to electronic or opto-electronic devices comprising such layers.

The technical field of the invention may be defined in general as the preparation of semiconducting material layers based on nitrides on a substrate.

Semiconducting materials based on nitrides of elements in groups III to V in the periodic table already occupy an important place in the electronic and opto-electronic fields, and this place will become increasingly important. The application field of these semiconducting materials based on nitrides actually covers a wide spectrum ranging between laser diodes to transistors capable of operating at high frequency and high temperature, and including ultraviolet light detectors, devices with acoustic surface waves and light emitting diodes (LEDs).

In these components, the most frequently used substrate for the growth of nitrides is sapphire, and to a lesser extent silicon carbide, SiC. These two materials, and particularly sapphire, have a number of disadvantages.

The disadvantages of sapphire are that it is an electrical insulator and a bad conductor of heat, while the disadvantages of SiC are that it is expensive and its quality is variable. Therefore, it was proposed to replace sapphire and SiC by silicon that has obvious economic and technical advantages compared with the two materials mentioned above.

The attractive properties of silicon include the fact that it is a good conductor of heat and that it can easily be eliminated chemically.

Furthermore, silicon is the preferred substrate for low cost mass production, since there is already a technological system based on silicon that is perfectly controlled on the industrial scale, and that its cost is significantly less than the cost of sapphire and sic.

The growth of nitrides such as gallium nitride on silicon substrates is hindered by problems related to the large differences between lattice parameters and the coefficient of thermal expansion of the substrate and the nitride. Therefore in order to grow a good quality nitride layer such as GaN, it is commonly accepted that a thin layer, for example of AlAs, SiC or AlN, called the "buffer layer" with a thickness of a few tens of nanometers, should be deposited on the silicon substrate before starting. This layer continuously covers the substrate and enables the GaN layer to grow two-dimensionally. However, the GaN layers on the silicon substrate are in tension, due to the mismatch mentioned above between the lattice parameter and the coefficient of thermal expansion between the silicon and GaN. The value of this tension stress generated during cooling after growth, increases with the thickness of the nitride layer such as GaN, and if this layer is thicker than a critical thickness, usually more than 1 µm, cracks are formed in it.

Consequently, nitride layers such as GaN layers epitaxied on a silicon substrate, are either thin and crack-free, or thick and cracked.

In both cases, it is difficult to use these layers.

The same problem arises for the growth of nitride layers, such as GaN, on substrates made of silicon carbide SiC.

It is obvious that increasing the thickness of the GaN layer also improves the structural, optical and electrical properties. Consequently, it would be very useful to be able to prepare thick and crack-free nitride layers, and particularly GaN layers, on a silicon substrate.

The document by S. A. NIKISHIN, N. N. FALEEV, V. G. ANTIPOV, S. FRANCOEUR, L. GRAVE DE PERALTA, G. A. SERYOGIN, H. TEMKIN, T. I. PROKOFYEVA, M. HOLTZ and S. N. G. CHU, APPL. PHYS. LETT. 75, 2 073 (1999) indicates that the growth mode for the thin AlN buffer layer deposited on the silicon substrate, must transit as quickly as possible towards a two-dimensional growth mode, if cracking is to be eliminated and the tension stress in GaN layers on silicon is to be limited. Crack free GaN layers with a thickness of up to 2.2 µm are thus obtained.

It is found that this increase in the critical thickness at which cracks appear is due to pre-treatment of the silicon substrate surface that consists of exposing the deoxidised silicon surface for a few seconds to ammonia before depositing a single layer of aluminium and beginning the growth of the AlN buffer layer.

Furthermore, with this pre-treatment, growth of the AlN buffer layer transits more quickly to a two-dimensional growth mode.

However, the layers prepared in this manner still have a small residual tension stress and the layer will crack if it is more than 2 µm thick.

Therefore, there is a need for monocrystalline layers of gallium nitride and gallium alloys, and particularly thick and continuous layers, in other words in which there are no cracks, on a substrate that could cause tension stresses in the layers.

There is also a need for a reliable, simple, reproducible and inexpensive process for preparation of such layers on a substrate.

The purpose of this invention is to satisfy all the needs mentioned above, and others, and to provide a layer and a process for preparation of this layer, that do not have the disadvantages, defects, limitations and disadvantages of layers and processes according to the prior art.

More precisely, the purpose of this invention is to provide crack free monocrystalline layers of gallium nitride and its alloys.

This and other purposes are achieved according to the invention by a crack-free monocrystalline layer of gallium nitride or of a mixed nitride of gallium and another metal, on a substrate that can cause tension stresses in the layer, said substrate being covered with a buffer layer; in which at least one monocrystalline layer of a material with a thickness of between 100 and 300 nm and preferably between 200 and 250 nm, for which the lattice parameter is smaller than the lattice parameter of gallium nitride or of a mixed nitride of gallium and another metal, is inserted in the layer of gallium nitride or of a mixed nitride of gallium and another metal.

According to the invention, the lattice parameter of the material used for the intermediate monocrystalline layer is smaller than the lattice parameter of the gallium nitride or of the mixed nitride of gallium and another metal.

For the required purpose, regardless of the intermediate layer and regardless of the monocrystalline layer of nitride, the lattice parameter of the intermediate monocrystalline layer must be smaller than the lattice parameter of the nitride layer.

The layer according to the invention may have any thickness, for example it may be 1 µm thick or even less. In particular, the layer according to the invention may be a thick layer; a thick layer according to the invention usually means a layer with a thickness of 2 μm or more, for example from 2 to 5 μm, and preferably more than 2 to 5 μm, or even better from 3 to 5 μm.

The layers according to the invention are fundamentally different from layers according to prior art in that they have at least one intermediate monocrystalline layer with a lattice parameter smaller than the lattice parameter of gallium nitride or of the mixed nitride of gallium and another metal, and in that this layer is specifically and fundamentally a monocrystalline layer and not a polycrystalline layer or even an amorphous layer, and finally in that the specific thickness of the intermediate layer is 100 to 300 nm. The objective according to the invention is to vary the stress, and therefore "thick" intermediate layers are used, whereas thin layers a few tens of nanometers thick are used in prior art, in which defects are exploited.

According to the invention, it is essential and fundamental that the layer according to the invention should comprise not only an inserted intermediate layer with a lattice parameter smaller than the lattice parameter of GaN, but furthermore also that this inserted intermediate layer should be a specific monocrystalline layer, and finally that this layer should have a specific thickness.

This layer is usually made under precise and defined conditions, particularly at high temperature, namely usually at a temperature between 800 to 1000° C., and preferably between 900 and 950° C.

The only way to successfully solve the specific technical problem of crack formation, is to use a specifically monocrystalline intermediate layer, advantageously made at high temperature according to the invention.

It has never been suggested or mentioned in prior art that a monocrystalline intermediate layer (for example made of AlN), advantageously made at high temperature, could help to make thick uncracked GaN layers.

The mismatch in the lattice parameter (namely the lattice parameter of the intermediate layer material being smaller than the lattice parameter of gallium nitride or of the mixed nitride of gallium and another metal) is such that the higher nitride layer(s) is (are) in compression during growth.

This compression compensates or even cancels out the tension stress that occurs during cooling, and surprisingly the layers of gallium nitride or of a mixed nitride of gallium and another metal may be thick and crack free, in other words they may be continuous on a substrate that could cause tension stresses in the layer.

Unlike the layers according to the document by NIKISHIN et al., the layers according to the invention comprise the buffer layer, but also another intermediate layer within the material made of gallium or of the mixed nitride of gallium and another metal, which effectively eliminates cracks that the buffer layer by itself cannot prevent.

In other words, in particular the intermediate layer according to the invention significantly increases the critical thickness at which cracks appear, above the critical thickness obtained when a buffer layer alone is used.

This means that the intermediate layer makes it possible to impose a higher compressive stress that precisely or partially, compensates for the tension stress formed during cooling. Consequently, the crack free thickness of the layers according to the invention has never been achieved before, since in the document mentioned above, the maximum thickness of crack free layers is only 2 μm, whereas it may be as much as 3 μm or even more (up to 5 μm) according to the invention.

However, note that the invention is not limited to "thick" layers, but is applicable to all layers with a structure according to the invention, for example layers will have a thickness of 1 μm or more.

Furthermore, the intermediate layer is fundamentally a monocrystalline layer, and is not an amorphous or polycrystalline layer.

Advantageously, the mixed gallium nitrides are chosen among mixed nitride of gallium and aluminium or indium.

The substrate may be any substrate used in the industry that could create tension stresses in the layer, but it will preferably be a substrate chosen from among silicon and silicon carbide substrates.

More precisely, according to the invention, we now have crack free layers, and particularly thick layers, on these substrates. There are many advantages with these substrates, but in the prior art the disadvantages related to the generated stresses were such that these substrates could not be used, despite these advantages.

Silicon carbide substrates prove to be particularly suitable for the types of components to be made with nitrides.

The silicon substrate is preferably a silicon substrate oriented along the (111) plane, and also preferably the silicon is deoxidised.

The buffer layer is preferably an AlN layer, and also preferably this layer is a thin layer, usually 10 to 50 nm thick.

The intermediate layer may also be made from the same material as the buffer layer, or it may be made from a different material. However, the intermediate is usually a layer of AlN or AlGaN. According to the invention, this layer is a monocrystalline layer.

The thickness of said intermediate layer is usually between 100 and 300 nm, and preferably between 200 and 250 nm.

The layer according to the invention may comprise 1 to 5 intermediate layers.

The invention also relates to a process for the preparation of a crack free monocrystalline layer of gallium nitride or of a mixed nitride of gallium and another metal on a substrate that could create tension stresses in the layer, said process comprising the following steps in sequence:

a) possible exposure of the heated substrate surface to ammonia; this treatment is carried out if the substrate is made of silicon;
b) deposition of a single atomic layer of aluminium;
c) deposition of a buffer layer;
d) growth of a deposit of gallium nitride or of a mixed nitride of gallium and another metal;
e) interruption of the growth of the deposit of gallium nitride or of the mixed nitride of gallium and another metal;
f) growth of an intermediate monocrystalline layer of a material for which the lattice parameter is smaller than the lattice parameter of gallium nitride or of the mixed nitride of gallium and another metal, and the thickness of which is between 100 and 300 nm, and preferably between 200 and 250 nm;
g) repetition of steps d) to f) if necessary;
h) continuation of the growth of the deposit of gallium nitride or of the mixed nitride of gallium and another metal, until the final required thickness of the layer of gallium nitride or of the mixed nitride of gallium and another metal;
i) cooling of the substrate and the layer of gallium nitride or of the mixed nitride of gallium and another metal.

The fundamental step in the process according to the invention that essentially differentiates the invention from processes according to prior art, is step f).

As already mentioned above, the fact of inserting at least one monocrystalline layer of a material with a lattice parameter (see above) different from the lattice parameter for gallium nitride, in other words a lattice parameter smaller than the lattice parameter of gallium nitride or smaller than the lattice parameter of mixed gallium nitride in the GaN layer or of the mixed nitride of gallium and another metal, compensates or even cancels out the tension stress that develops during cooling, for example down to ambient temperature, and consequently by using the process according to the invention, continuous crack free layers, and in particular thick layers, can be prepared on a substrate that can cause or induce tension stresses in the layer.

Step f) for growth of an intermediate layer that is specifically and fundamentally monocrystalline, makes it possible to impose a higher compressive stress than the stress created in the process according to prior art, described in the document by NIKISHIN et al.

This compressive stress precisely or partially compensates for the tension stress that is generated during cooling, with the result that the layers produced can be relaxed, and the critical thickness of these layers at which cracks appear is increased significantly, as mentioned above.

The state of stress in the layers obtained is different, depending on their thickness. Thin layers, less than 1 µm thick, are relaxed, whereas layers more than 1 µm thick are in tension again, but they do not crack unless they are more than 3 µm thick.

It was absolutely not predictable that the addition of this additional step f) for growth of an intermediate, fundamentally monocrystalline layer with a specific thickness, to the known steps a), b), c), d) according to the process according to prior art, could solve the disadvantages of prior art.

By growing an intermediate layer, in addition to the surface pre-treatment a) according to prior art, thick layers (and particularly thick relaxed layers or uncracked stressed layers) can be prepared according to the invention.

According to the invention, it is also essential that the intermediate layer that is grown should be a monocrystalline layer which, alone, makes it possible to obtain the final layers, and particularly thick crack free layers.

It is also important that the specific thickness of the intermediate layer should be between 100 and 300 nm, so that the stress can be varied.

In other words, although steps a), b), c) and d) of the process according to the invention are similar to the process according to prior art mentioned above, a comparison between the values of the residual stress and the maximum possible crack free thickness which is usually 3 µm or more with this process, compared with 2 µm in prior art, demonstrates that the additional step in the process according to the invention performs an essential and decisive role in increasing the compressive stress and further compensates for the tension that occurs during cooling.

Conditions for growth of the intermediate layer according to the invention are important and must be chosen precisely, so that this layer is monocrystalline.

In particular, the temperature used during growth of the intermediate layer is advantageously a high temperature, and usually 800 to 1000° C. and preferably from 900 to 950° C.

The other particular parameters or growth conditions that usually have to be chosen precisely are the growth rate and the thickness of the intermediate layer to be grown.

Furthermore, the process according to the invention is simple, reliable and reproducible, thus for example it has been demonstrated that reproducibility of the process for about 20 layers produced is 100%.

As mentioned above, the substrate may be any substrate that could cause tension stresses in the layer. This is one of the advantages of the process according to the invention, in that a priori it no longer depends on the substrate and it can be very broadly applied. The essential step in which a monocrystalline layer, for example an AlN layer, has to be inserted in the layer of gallium nitride or of the mixed nitride of gallium and another metal, is completely independent of the substrate. The preferred substrates were described above.

Furthermore, the process according to the invention may indifferently use any growth technique for deposition of the buffer layer, the growth of deposits of gallium nitride or of the mixed nitride of gallium and another metal, and for growth of the intermediate layer. However, the growth conditions of this layer must be such that it is monocrystalline.

Therefore, Molecular Beam Epitaxy (MBE), already mentioned above, or Metalorganic Chemical Vapour Deposition (MOCVD), or Hydride Vapour Phase Epitaxy (HVPE) can also be used for growth of these layers and deposits. The preferred process is MBE, particularly under the conditions described below in which growth of a monocrystalline intermediate layer is possible: temperature from 800 to 1000° C., and preferably from 900 to 950° C., and growth rate from 0.1 to 0.5 µm/h.

With the process according to the invention, it is also possible to deposit several intermediate layers, for example of AlN in the gallium nitride layer or the layer of a mixed nitride of gallium and another metal, in other words as mentioned in g), steps d) to f) may be repeated, for example between 1 and 5 times, thus leading to the deposition of 2 to 6 intermediate monocrystalline layers.

Therefore, the process according to the invention is extremely flexible, both from the point of view of choosing the substrate, and the process for the growth of deposits and layers.

This is not the case for the process according to prior art as described in the document by NIKISHIN et al., since it is obvious that in this process, the speed of the transition from three-dimensional to two-dimensional growth of the AlN layer will be dependent on the substrate and the growth technique used.

Furthermore, this process can only apply to the interface between the substrate and the AlN buffer layer once. Therefore the process according to the invention has the advantage that it can be applied and transposed unchanged, for example when using silicon carbide substrates instead of silicon substrates, as we have already seen these SiC substrates are particularly suitable for the types of components that we would like to make with nitrides.

The invention also relates to an electronic and/or optoelectronic device comprising at least one thick and crack free monocrystalline layer of gallium nitride or of a mixed nitride of gallium and another metal, according to the invention, as described above.

For example, these devices may be laser diodes, transistors capable of operating at high frequency and high temperature, ultraviolet light detectors, acoustic surface wave devices, light emitting diodes, etc.

Inclusion of layers according to the invention in these electronic devices significantly improves performances and it is obvious that increasing the thickness of the gallium nitride layer or of a mixed nitride of gallium and another metal, can improve the structural, optical and electrical properties at the same time. For example, the only existing document that describes the manufacture of transistors based on nitride heterostructures on a silicon substrate, by A. T. SCHREMER, J. A. SMART, Y. WANG, O. AMBACHER, N. C. Mac- DONALD and J. R. SHEALY, Appl. Phys. Lett. 76, 736 (2000), mentions mobility values of between 600 and 700 cm$^2$/Vs, whereas if layers according to the invention are used, values higher than 1500 cm$^2$/Vs are obtained at 300 K. This is essentially due to the fact that in this document, it is impossible to make layers thicker than 0.7 μm without the formation of cracks. Thus, the quality of heterostructures according to this document are not as good as heterostructures made according to the invention on layers at least 2 μm thick.

This example dealing with the improvement of performances applies to transistors, but in reality, regardless of the application the products that will be made from thick layers according to the invention will have better characteristics than products made with thin layers, simply because as the distance between the interface and the substrate increases, the quality of the epitaxied material will also improve.

The invention will now be described more precisely in the detailed description given below for illustrative and non-limitative purposes, with reference to the appended drawings in which.

The process according to the invention and the layers according to the invention are described below.

The substrates used are preferably silicon wafers in the (111) plane.

Figure 1:
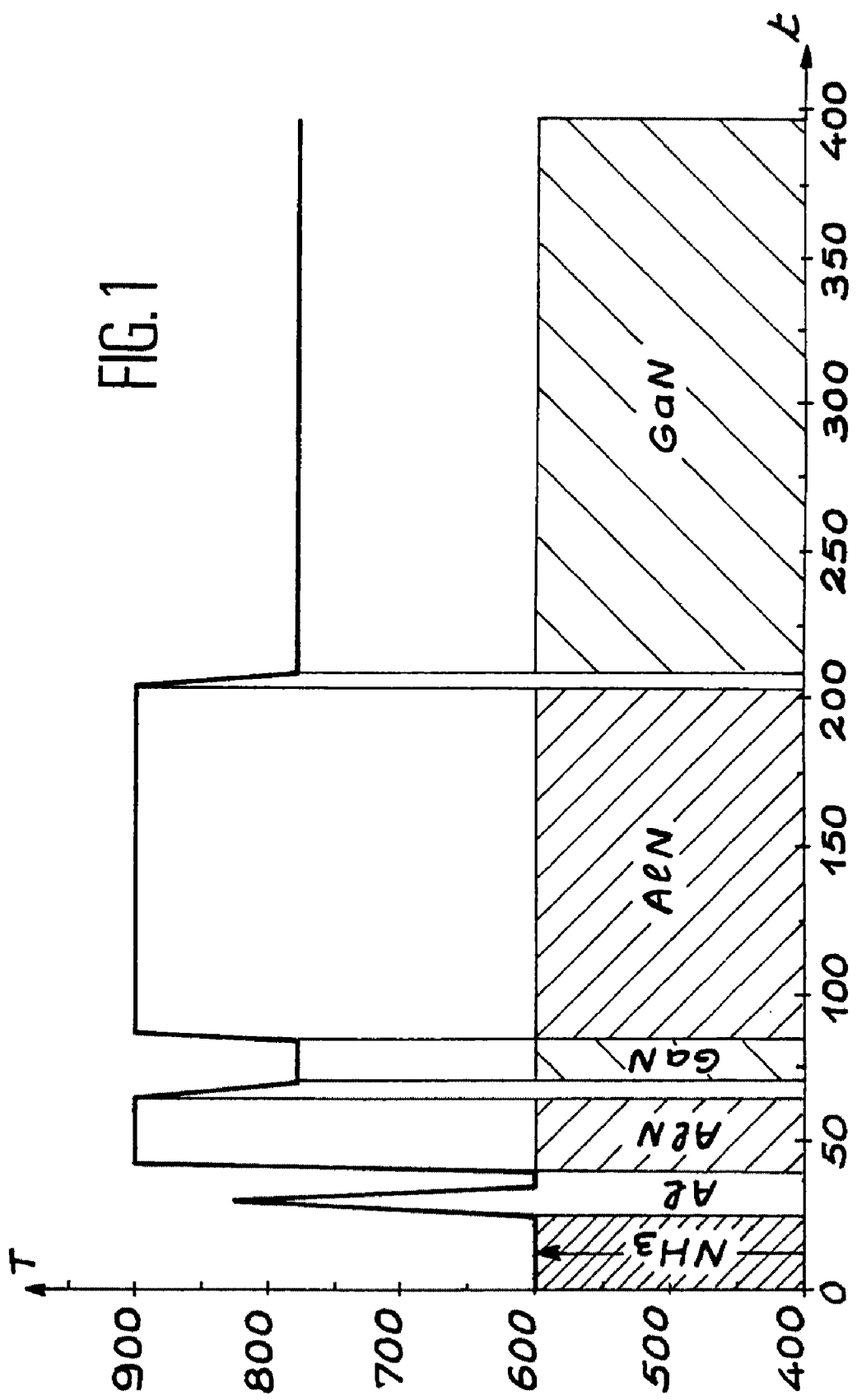
FIG. 1 shows a chart that diagrammatically shows the different steps in the process according to the invention for deposits and growth by MBE, showing the temperature T (° C.) as a function of the time (minutes) in these various steps.

Before starting growth of the layer itself, the native oxide layer that covers the silicon substrate is evaporated in situ in the growth chamber by fast thermal annealing, for example up to 950° C.; this is called the "deoxidation" step (step 0) which is not shown in FIG. 1.

The next step is to begin the process according to the invention (at time 0 in FIG. 1). The temperature of the substrate is usually fixed, for example, at 600° C. and the silicon surface is exposed to ammonia for a few seconds (usually from 2 to 10 seconds) (step 1).

The substrate temperature is then increased, generally up to about 830° C. The temperature of the substrate is then lowered, generally to 600° C., and a single atomic layer of aluminium is then deposited (step 2).

The growth of the buffer layer, usually AlN, is then initiated by increasing the temperature to 900° C. (step 3).

Note that the process described in this document is the MBE process (Molecular Beam Epitaxy).

After a deposition of 10 to 50 nanometers of the buffer layer, for example for 30 minutes, growth is stopped and the temperature generally drops to 780° C. The GaN or a mixed nitride of gallium and another metal is grown at this temperature on the buffer layer, for example made of AlN (step 4).

The growth of GaN or of the mixed nitride of gallium and another metal, is generally interrupted after deposition of a 100 to 300 nm thickness (for example 250 nm in FIG. 1) and the temperature is generally increased to 900° C. for growth of an intermediate monocrystalline layer of AlN, in the case in which the buffer layer and the intermediate layer are both composed of AlN. The thickness of this monocrystalline intermediate layer is usually between 100 and 300 nm.

After growth of this monocrystalline intermediate layer, the temperature is lowered again generally to 780° C. as before, to restart growth of the GaN or of the mixed nitride of gallium and another metal until reaching the required final thickness (step 6) which is usually from 2 to 5 μm.

Note that the different parameters such as the temperature, duration, reagents used, etc., for the deposition and growth steps of the buffer or GaN layer or of the layer of the mixed nitride of gallium and another metal, and for example the surface treatment of the substrate are known and/or may easily be determined by those skilled in the art. The values given above are given for guidance.

However, the conditions for deposition of the intermediate, monocrystalline layer, essential to the invention are specific, precisely to enable growth of a monocrystalline layer.

Figure 2:
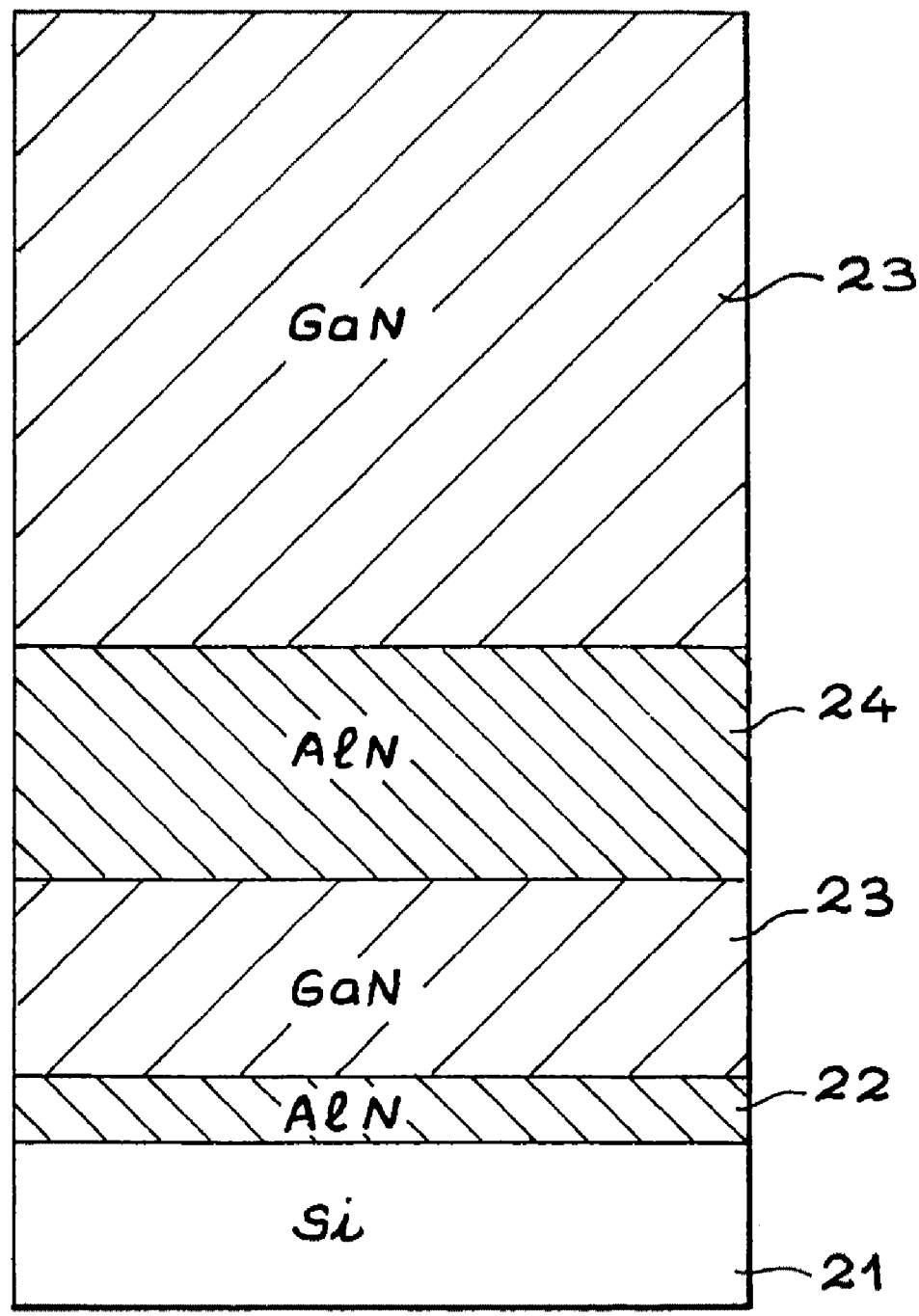
FIG. 2 shows a diagrammatic section through a GaN layer according to the invention.

FIG. 1 mentioned above diagrammatically shows the different steps in the process according to the is invention and after deoxidation of the substrate, while FIG. 2 shows a diagrammatic section of the structure of the layer thus made according to the invention; for example with a substrate (21) made of Si (111), a buffer layer made for example of AlN (22) and a layer of GaN (23) in which there is an intermediate layer of AlN (24).

The invention will now be described with reference to the following examples given for illustrative and non restrictive purposes.

EXAMPLE 1

In this example, Molecular Beam Epitaxy (MBE) is used to prepare a 2 μm thick layer of GaN according to the invention on a silicon substrate, in other words with a 250 μm thick intermediate AlN monocrystalline layer.

The silicon substrate is heated to about 600° C. for about 10 hours under an ultra vacuum, to degas it. It is then placed in the growth chamber and the temperature is quickly increased to about 950° C. in order to remove the silicon oxide layer on the surface. The temperature is then lowered to about 600° C. to expose the silicon surface to an ammonia flow for 2 seconds.

The temperature is then increased to 820° C. and is then lowered to about 600° C. again. At this temperature, a single layer of aluminium (equivalent to a 10-second deposit) is deposited, and the temperature is then increased to 600° C. At this temperature, ammonia and aluminium are added simultaneously to make the buffer layer of aluminium nitride (AlN). The temperature is gradually increased during the first 2 minutes to reach a temperature of the order of 900° C. and this temperature is maintained to make the 50 nanometers of AlN grow to form the buffer layer (namely about 20 minutes under our growth conditions). Once the buffer layer is finished, the temperature is lowered to about 780° C. and the growth of gallium nitride (GaN) is started. A 250 nanometer layer of GaN is grown (requiring about 15 minutes under our growth conditions).

Once this 250 nm thickness has been reached, the growth of the intermediate monocrystalline layer of AlN is started. The beginning of this growth takes place at 780° C., but the temperature is quickly increased to 900° C. (the temperature rise takes 2 minutes). The thickness of the intermediate AlN layer is 250 nm (which takes about 2 hours under our growth conditions). Once this layer is finished, the temperature is lowered to about 780° C. and growth of the 2 micrometer thick GaN layer is started, and lasts for about 2 hours.

EXAMPLE 2

Comparison

In this example, Molecular Beam Epitaxy (MBE) is used to prepare a layer of GaN with the same thickness as the layer in example 1 (2 µm), under the same conditions as in example 1 but without the intermediate layer of AlN, for comparison purposes.

The silicon substrate is heated to about 600° C. for about 10 hours under an ultra vacuum to degas it. It is then placed in the growth chamber and its temperature is increased quickly to the order of 950° C. in order to remove the layer of silicon oxide located on the surface. The temperature is then lowered to about 600° C. to expose the silicon surface to the ammonia flow for 2 seconds.

The temperature is then increased to 820° C. and it is lowered again to about 600° C. A single layer of aluminium is deposited at this temperature (equivalent to a 10 second deposit) and the temperature is then increased to 650° C. At this temperature, ammonia and aluminium are added simultaneously to make the buffer layer of aluminium nitride (AlN). During the first two minutes, the temperature is gradually increased up to the order of 900° C. and is kept at this value to grow the 50 nanometers of AlN in the buffer layer (which is about 20 minutes under our growth conditions). Once the buffer layer is finished, the temperature is lowered to about 780° C. and growth of the 2 micrometer thick GaN layer is started, and lasts for about 2 hours.

Figure 3A:
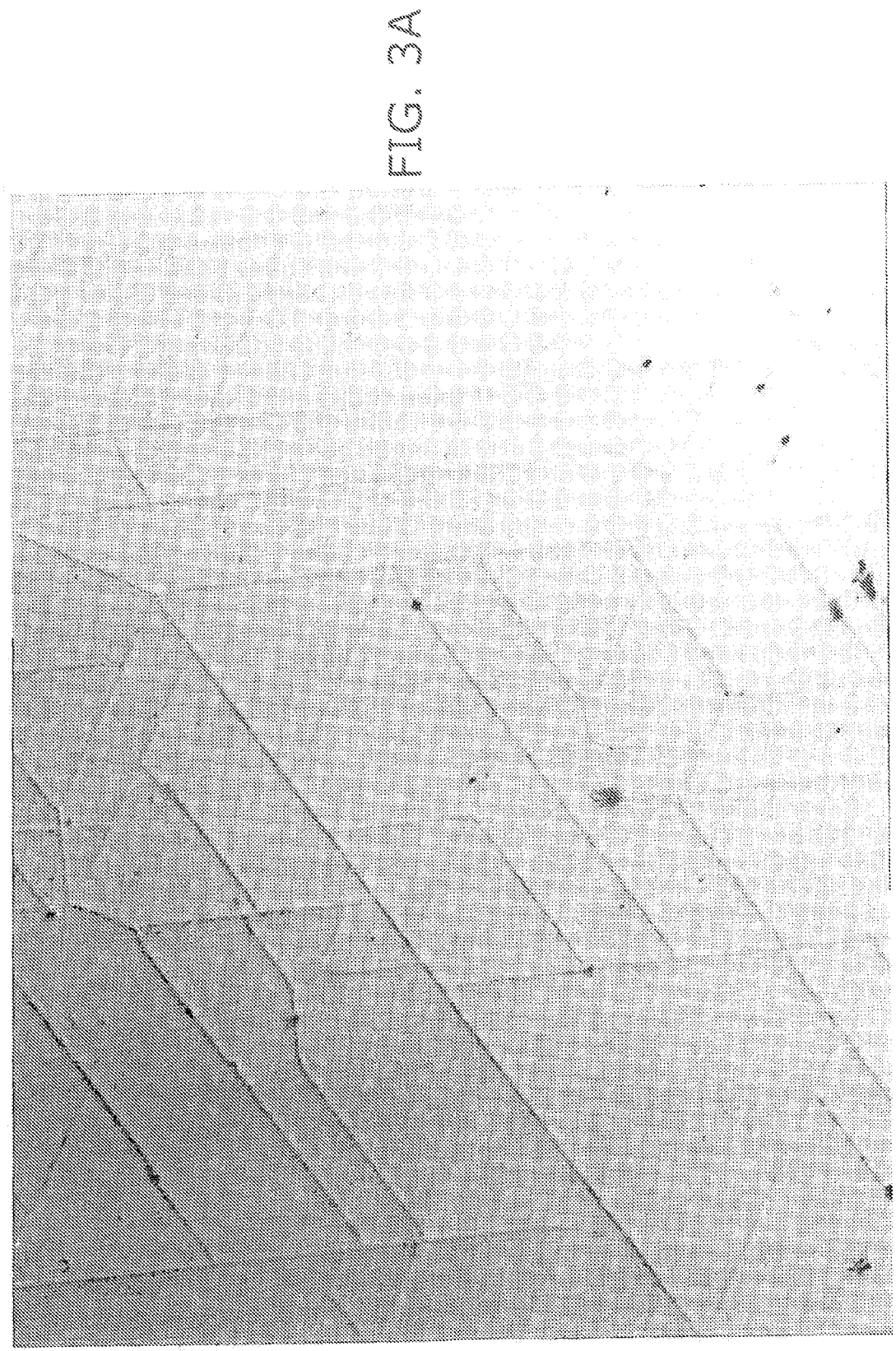
FIGS. 3A and 3B are optical microscope photographs of a 2 μm thick layer of GaN that does not comprise an intermediate layer (not conform with the invention), and a 2 μm thick GaN layer that does comprise an intermediate layer (conform with the invention)
Figure 3B:
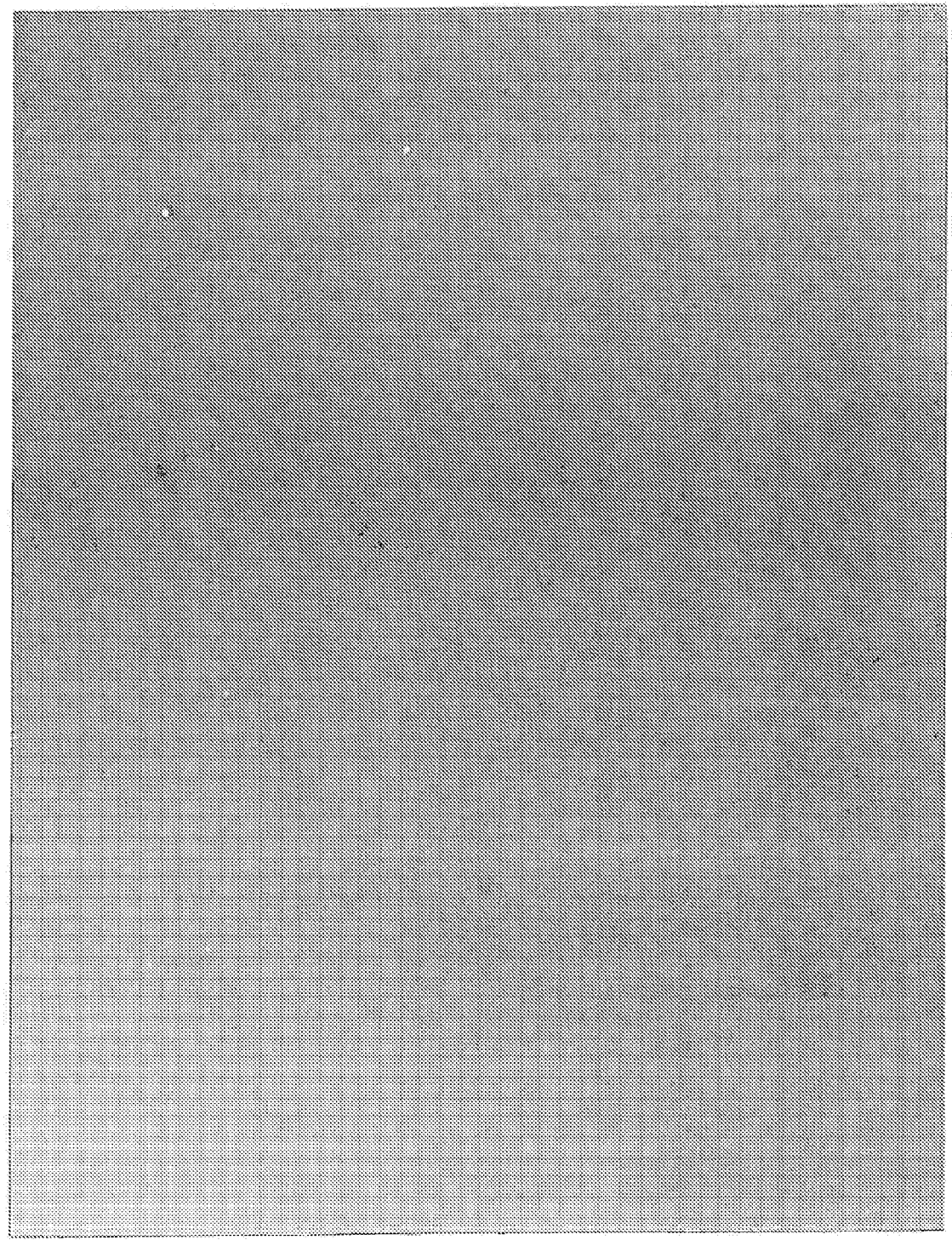

Observation of the layers prepared in examples 1 and 2 using an optical microscope (plates in FIGS. 3A and 3B) at a magnification of ×100 shows that the GaN layer made without an intermediate AlN layer (example 2, FIG. 3A, for comparison and not conform with the invention) is completely cracked whereas the layer of GaN made with the intermediate monocrystalline layer (example 1, FIG. 3B, conform with the invention) is continuous and entirely crack free.

EXAMPLE 3

In this example, a 1 micrometer thick layer of GaN is prepared by Molecular Beam Epitaxy according to the invention under the same conditions as in example 1, in other words with a 250 nm thick intermediate monocrystalline layer of AlN.

The silicon substrate is heated under an ultra vacuum for about 10 hours at about 600° C. to degas it. It is then inserted into the growth chamber and the temperature is quickly increased to about 950° C. in order to remove the silicon oxide layer on the surface. The temperature is then lowered to about 600° C. to expose the silicon surface to the ammonia flow for about 2 seconds.

The temperature is then increased to 820° C. and then lowered again to about 600° C. At this temperature, a single layer of aluminium is deposited (equivalent to a 10 second deposit) and the temperature is then increased to 650° C. At this temperature, ammonia and aluminium are added simultaneously to make the buffer layer of aluminium nitride (AlN). For the first 2 minutes, the temperature is increased gradually to reach a temperature of the order of 900° C. and this temperature is maintained to make the 50 nanometers of AlN in the buffer layer grow (this takes about 20 minutes under our growth conditions). Once the buffer layer is finished, the temperature is lowered to about 780° C. and growth of gallium nitride (GaN) is started. A 250 nanometer thick GaN layer is grown (which takes about 15 minutes under our growth conditions).

Once the 250 nm thickness has been reached, growth of the intermediate AlN monocrystalline layer is started. Growth begins at 780° C., but the temperature is quickly increased to 900° C. (the temperature rise lasts for 2 minutes). The thickness of the intermediate monocrystalline AlN layer is 250 nm (which is equivalent to about 2 hours under our growth conditions). Once this layer is finished, the temperature is lowered to about 780° C. and growth of the 1 µm thick GaN layer is started, which is the equivalent of about 1 hour.

EXAMPLE 4

Comparison

A layer of GaN with the same thickness as that in example 3 (1 µm) is prepared under the same conditions as in example 3, but omitting the intermediate monocrystalline layer of AlN, for comparison purposes.

The silicon substrate is heated to about 600° C. for about 10 hours under an ultra-vacuum to degas it. It is then placed in the growth chamber and the temperature is quickly increased to about 950° C. in order to remove the silicon oxide layer on the surface. The temperature is then lowered to about 600° C. to expose the silicon surface to the ammonia flow for 2 seconds.

The temperature is then increased to 820° C. and is then lowered again to about 600° C. A single layer of aluminium is deposited at this temperature (equivalent to a 10 second deposition), and the temperature is then increased to 650° C. Ammonia and aluminium are added simultaneously at this temperature, to make the buffer layer of aluminium nitride (AlN). For the first two minutes, the temperature is increased gradually to reach a temperature of the order of 900° C., and this temperature is maintained to enable growth of the 50 nanometers of AlN in the buffer layer (about 20 minutes under our growth conditions). Once the buffer layer is finished, the temperature is lowered to about 780° C. and growth of the 1 micrometer thick GaN layer is started, which takes about 1 hour.

Figure 4A:
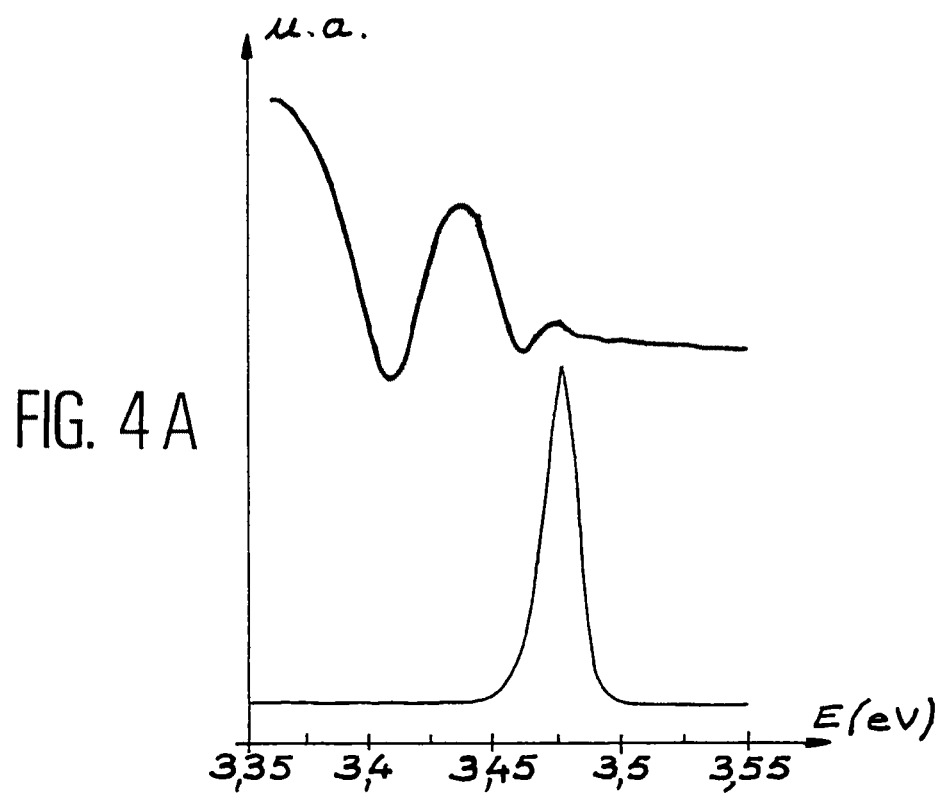
FIGS. 4A and 4B are photo luminescence and reflectivity spectra respectively, obtained with 1 μm thick GaN without an intermediate layer (not conform with the invention) and a GaN layer of the same thickness comprising an intermediate layer (conform with the invention) respectively. The ordinates are in arbitrary units (ua) and the abscissas represent the photon energy E (eV).
Figure 4B:
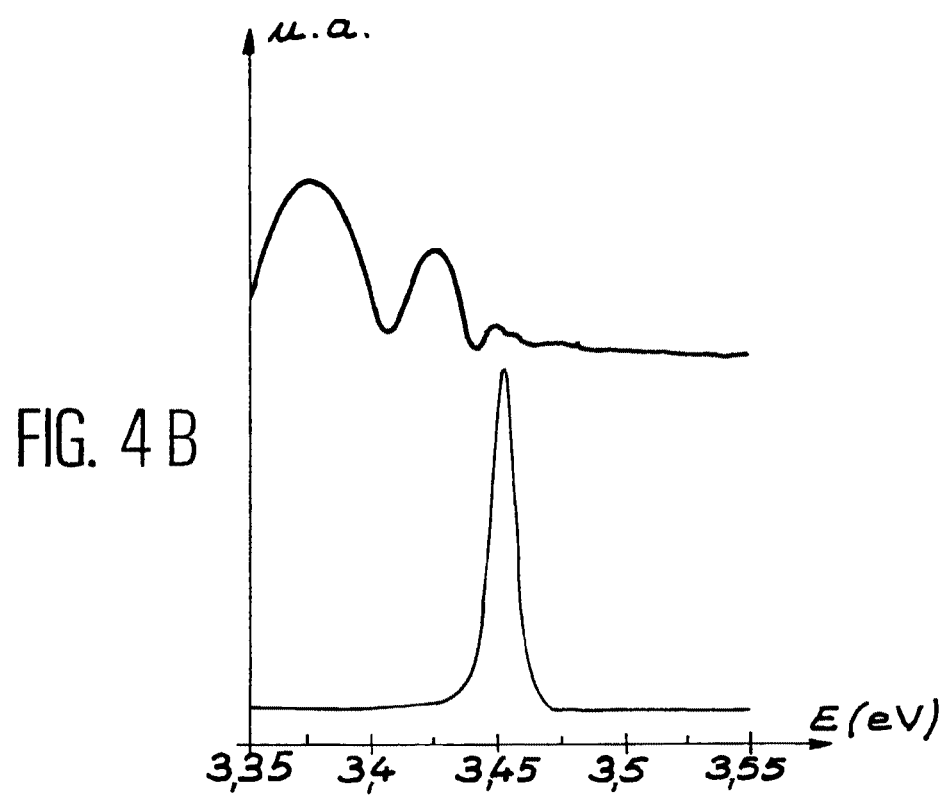

In order to quantify the stress present in the GaN layers, we combined the photo luminescence and reflectivity experiments carried out on the layers in examples 3 and 4. These experiments are used conventionally in the physics of semiconductors to determine the precise stress state of materials. The spectra obtained on the two layers of GaN with equal thickness (1 µm), one made without the intermediate layer (example 4) and the other made with the intermediate layer of AlN (example 3) are shown in FIGS. 4B and 4A. An analysis of these spectra shows that the layer of GaN obtained without the intermediate layer of AlN is in tension, whereas the layer of GaN obtained with the intermediate monocrystalline layer of AlN is relaxed (the objective is to precisely determine the prohibited band of the GaN material by the energy position of the free exciton A).

The invention claimed is:

1. A semiconductor structure comprising:
a) a substrate;
b) a buffer layer deposited on the substrate; and
c) a composite layer of nitride material disposed on the buffer layer that is thick and crack-free, the nitride layer including:
  i) a first nitride layer portion adjacent the buffer layer;
  ii) a monocrystalline intermediate layer disposed on the first nitride layer portion; and iii) a second nitride layer portion disposed on the monocrystalline intermediate layer, wherein a lattice parameter of the monocrystalline intermediate layer is smaller than a lattice parameter of the first and second nitride layer portions.

2. A semiconductor structure as recited in claim 1, wherein the substrate includes material capable of causing tension stresses in the composite layer of nitride material.

3. A semiconductor structure as recited in claim 2, wherein the substrate includes material selected from the group consisting of silicon, sapphire and SiC.

4. A semiconductor structure as recited in claim 1, wherein the substrate is deoxidized and oriented along the (111) plane.

5. A semiconductor structure as recited in claim 1, wherein the buffer layer includes AlN substantially uniformly disposed over the substrate.

6. A semiconductor structure as recited in claim 1, wherein the buffer layer is between about 10 nm and about 50 nm in thickness.

7. A semiconductor structure as recited in claim 1, wherein the monocrystalline intermediate layer includes material selected from the group consisting of AlN and AlGaN.

8. A semiconductor structure as recited in claim 1, wherein the first and second nitride layer portions include material selected from the group consisting of GaN, AlGaN and InGaN.

9. A semiconductor structure as recited in claim 1, wherein the first and second nitride layer portions are made of the same material.

10. A semiconductor structure as recited in claim 1, further comprising a second intermediate layer within the nitride layer.

11. A semiconductor structure as recited in claim 10, further comprising:
a) a third intermediate layer within the nitride layer;
b) a fourth intermediate layer within the nitride layer;
c) a fifth intermediate layer within the nitride layer; and
d) a sixth intermediate layer within the nitride layer.

12. A semiconductor structure as recited in claim 11, wherein the second, third, fourth, fifth and sixth intermediate layers include material selected from the group consisting of GaN, AlGaN and InGaN.

13. A semiconductor structure as recited in claim 1, wherein the monocrystalline intermediate layer is between about 100nm and about 300 nm.

14. A semiconductor structure as recited in claim 1, wherein the monocrystalline intermediate layer is between about 200nm and about 300 nm.

15. A semiconductor structure as recited in claim 1, wherein the monocrystalline intermediate layer is between about 200nm and about 250 nm.

16. A semiconductor structure as recited in claim 1, wherein the composite layer of nitride material is at least about 3 μm thick.

17. A semiconductor structure as recited in claim 1, wherein the composite layer of nitride material is about 5 μm thick.

18. A device including the semiconductor structure of claim 1.

19. A device as recited in claim 18 selected from the group consisting of (i) an electronic device and an opto-electronic device.

20. An device as recited in claim 19, wherein the device is selected from the group consisting of a (i) laser diode, (ii) a transistor, (iii) an ultraviolet light detector, (iv) an acoustic surface wave device and a (v) a light emitting diode.

* * * * *